(12) United States Patent
Meister et al.

(10) Patent No.: US 7,956,705 B2
(45) Date of Patent: Jun. 7, 2011

(54) CIRCUIT WORKING WITH ACOUSTIC VOLUME WAVES AND COMPONENT CONNECTED TO THE CIRCUIT

(75) Inventors: Veit Meister, Kagel (DE); Werner Ruile, Munich (DE)

(73) Assignee: EPCOS AG, Munich (DE)

( * ) Notice: Subject to any disclaimer, the term of this patent is extended or adjusted under 35 U.S.C. 154(b) by 361 days.

(21) Appl. No.: 11/576,985

(22) PCT Filed: Sep. 23, 2005

(86) PCT No.: PCT/EP2005/010336
§ 371 (c)(1),
(2), (4) Date: Jul. 15, 2008

(87) PCT Pub. No.: WO2006/039996
PCT Pub. Date: Apr. 20, 2006

(65) Prior Publication Data
US 2008/0297277 A1 Dec. 4, 2008

(30) Foreign Application Priority Data
Oct. 11, 2004 (DE) .......................... 10 2004 049 499

(51) Int. Cl.
*H03H 9/205* (2006.01)
*H01L 41/087* (2006.01)

(52) U.S. Cl. ......................................... 333/189; 333/192

(58) Field of Classification Search .................. 333/187, 333/188, 189, 190, 191, 192
See application file for complete search history.

(56) References Cited

U.S. PATENT DOCUMENTS

| 3,836,877 A | 9/1974 | Guntersdorfer et al. |
| 4,329,666 A | 5/1982 | Arvanitis |
| 5,294,898 A * | 3/1994 | Dworsky et al. ............... 333/189 |
| 5,910,756 A | 6/1999 | Ella |
| 6,121,856 A | 9/2000 | Apostolos |
| 6,720,844 B1 * | 4/2004 | Lakin ............................ 333/189 |
| 7,057,478 B2 | 6/2006 | Korden et al. |
| 7,098,758 B2 | 8/2006 | Wang et al. |
| 7,262,676 B2 | 8/2007 | Ruile et al. |
| 2003/0128081 A1 | 7/2003 | Ella et al. |
| 2005/0012570 A1 | 1/2005 | Korden |
| 2005/0057323 A1 | 3/2005 | Kando |
| 2008/0094150 A1 | 4/2008 | Meister et al. |
| 2010/0039000 A1 | 2/2010 | Milson et al. |

FOREIGN PATENT DOCUMENTS

DE  103 19 554  11/2004

(Continued)

OTHER PUBLICATIONS

Written Opinion with English translation for PCT/EP2005/010336.

(Continued)

*Primary Examiner* — Dean O Takaoka
(74) *Attorney, Agent, or Firm* — Fish & Richardson P.C.

(57) ABSTRACT

The invention relates to a circuit operating with bulk acoustic waves with at least electroacoustic systems, each arranged in a branch (Z1, Z2, Z3, Z4), wherein each electroacoustic system comprises at least two series-connected resonators (R11, R12; R21, R22; R31, R32; R41, R42) in the respective branch, which are galvanically separated from one another and acoustically coupled to one another by means of a coupling system (K1, K2, K3, K4) arranged therebetween. The electroacoustic systems are acoustically coupled via their coupling system (K1, K2) and/or electrically coupled to one another.

29 Claims, 12 Drawing Sheets

FOREIGN PATENT DOCUMENTS

| | | |
|---|---|---|
| JP | 2004-159262 | 6/2004 |
| WO | WO01/99276 | 12/2001 |
| WO | WO2006/039996 | 4/2006 |
| WO | WO2006/040001 | 4/2006 |

OTHER PUBLICATIONS

English translation of Search Report for PCT/EP2005/010336.

Lakin K M "Thin Film Resonator Technology" Proc of the 2003 IEEE Intl Frequency Control Symp & PDA Exhibition Jointly with the 17$^{th}$ European Frequency and Time Forum, XP010688892, pp. 765-778.

International Search Report in Application No. PCT/EP2005/010336, dated Jan. 16, 2006.

International Search Report in Application No. PCT/EP2005/010387, dated Mar. 10, 2006.

Fattinger et al., "Coupled Bulk Acoustic Wave Resonator Filters: Key Technology for Single-to-Balanced RF Filters", IEEE MTT-S Digest, pp. 927-929 (2004).

Elbrecht et al., "Integration of Bulk Acoustic Wave Filters: Concepts and Trends", IEEE MTT-S Digest, pp. 395-398 (2004).

Franosch et al., "Wafer-Level-Package for Bulk Acoustic Wave (BAW) Filters", IEEE MTT-S Digest, pp. 493-496 (2004).

Action and Response History in U.S. Appl. No. 11/576,981, retrieved from PAIR on Dec. 14, 2010.

English Translation of Intl. Preliminary Report on Patentability & Written Opinion in Application No. PCT/EP2005/010336, dated Apr. 24, 2007.

English Translation of Intl. Preliminary Report on Patentability & Written Opinion in Application No. PCT/EP2005/010387 dated Apr. 24, 2007.

* cited by examiner

CIRCUIT WORKING WITH ACOUSTIC VOLUME WAVES AND COMPONENT CONNECTED TO THE CIRCUIT

TECHNICAL FIELD

This patent application describes a circuit operating with bulk acoustic waves, in particular, a bandpass filter.

BACKGROUND

Filters operating with bulk acoustic waves—stacked crystal filters—with thin-film resonators (FBAR=Thin Film Bulk Acoustic Resonator) stacked one atop the other are known from U.S. Pat. No. 5,910,756. A circuit comprising two symmetric electrical ports is known from FIG. 12 of that publication.

SUMMARY

Described herein is a circuit operating with acoustic waves that is suitable for a symmetric/symmetric or an asymmetric/symmetric operation, as well as other functionalities.

This patent application describes a circuit operating with bulk acoustic waves, with at least two electroacoustic systems, each arranged in a branch. Each electroacoustic system comprises at least two resonators connected in series in the respective branch, which are galvanically separated from one another and acoustically coupled to one another by a coupling system arranged between them.

Here, two different electroacoustic systems are arranged in branches different from one another. The electroacoustic systems are electroacoustically coupled to one another via their coupling systems. An electroacoustic coupling is understood to mean an acoustic and/or electrical coupling.

The electroacoustic coupling between two electroacoustic systems by their coupling systems is referred to below simply as coupling.

A bulk acoustic wave resonator—such as a thin-film resonator or FBAR (Thin Film Bulk Acoustic Wave Resonator)—comprises a piezoelectric layer arranged between two electrodes. Each resonator is characterized by its resonance frequency and its antiresonance frequency. Resonators can each contribute to the appearance of poles in the transfer function. Two coupled resonators generate an additional pole.

The coupling between different branches of a circuit can therefore be exploited to produce additional poles, whereby, for example, the suppression in a stopband of the circuit can be increased.

By galvanically decoupling the resonators arranged on the input side and the output side, the circuit can be successfully operated in balanced/balanced mode or in unbalanced/balanced mode. In one embodiment, a difference-forming circuit can successfully be realized by virtue of the coupling of two branches formed as symmetric signal paths and the adjustment of the phases in the resonators associated with the same side, for example. The phases of the acoustic waves to be excited in different paths can be adjusted by, for instance, an appropriate interconnection, to be described in detail below, of the resonators arranged in the different signal paths.

The circuit is connected between two electrical ports with two terminals, at least one of the ports being symmetrically operated. A first signal path is arranged between the first terminals of the two ports. A second signal path is arranged between the second terminals of the two ports. At least one shunt arm (parallel branch), arranged between the two terminals of the first (or the second) port, can be provided.

In one embodiment, the first branch corresponds to the first signal path and the second branch to the second signal path. The first electroacoustic system is arranged in the first signal path, and the second electroacoustic system in the second signal path. In this case, a resonator arranged on the input side in the circuit is referred to as the first resonator of the respective electroacoustic system. A resonator arranged on the output side in the circuit is referred to as the second resonator of the respective electroacoustic system.

Different electroacoustic systems can also be arranged in different parallel branches arranged between the first and the second signal path. The first branch here corresponds to a shunt arm connecting the first and second signal paths, and the second branch corresponds to a second shunt arm connected in parallel with the first shunt arm.

It is also possible to arrange a first electroacoustic system in one signal path, or the first branch, and to arrange a second electroacoustic system coupled to the latter in the parallel branch. One electroacoustic system, coupled acoustically and/or electrically via its coupling system to the coupling system of an additional electroacoustic system in the parallel branch, may be arranged in each of the two signal paths (or branches).

With an appropriate interconnection of the resonators, described below, the circuit in one embodiment is capable of an impedance conversion, by a factor of 4, for example, between the ports connected to the circuit.

In one embodiment, the first resonators arranged in different branches can form a series circuit connected to the first port. The second resonators arranged in different branches here may form a parallel circuit connected to the second port. Alternatively, the two second resonators can form a series circuit.

In another embodiment, the first resonators arranged in different branches can form a parallel circuit that is connected to the first port. The second resonators arranged in different branches may form a series circuit that is connected to the second port. Alternatively, the second resonators can form a parallel circuit.

In case of more than only two branches coupled to one another, it is possible to connect one part of the first (or second) resonators in series and to connect the remaining first (or second) resonators in parallel.

The first and the second coupling systems can be galvanically, i.e., directly, coupled to one another, e.g., via a floating metal surface, with an electroacoustic signal in, for example, the first signal path being coupled via an electrical connection into the second signal path. The coupled signal can be superimposed (constructively or destructively) on the signal transmitted in the second signal path. An inductive coupling of coupling systems via an inductor is also possible.

A capacitive coupling of the first and second coupling systems in place of the continuous metal surface is also possible. It is possible to combine different couplings (capacitive, inductive, galvanic, acoustic) with one another. Furthermore, an electromagnetic coupling of the of the coupling system by, for instance, a transformer (e.g., electromagnetic coupled coils, each connected to reference potential) is possible.

In case resonators (associated with the same side of the circuit) are coupled, an acoustic, galvanic, capacitive or inductive coupling is possible.

Acoustic coupling can take place in the vertical direction between resonators arranged one above the other. Acoustic coupling can also be done laterally via lateral acoustic modes between resonators arranged side by side.

An electrical connection between, for instance, the coupling systems, or between the first (or second) resonators of different electroacoustic systems, can be floating.

The floating electrical connection may include a metal surface that is electrically isolated from the resonator electrodes electroconductively connected to the ports.

The first and the second coupling system and/or, for instance, two first resonators can also be connected electrically to one another via an electrical connection that is connected to a first reference potential. In one embodiment, the second terminal of the first port is electrically connected to the first reference potential.

In one embodiment the second resonator of the first electroacoustic system is arranged between the first terminal of the second port and a second reference potential. The second resonator of the second electroacoustic system here may be arranged between the second terminal of the second port and a third reference potential.

In one embodiment, the first resonator, the first coupling system and the second resonator of the first electroacoustic system are arranged one above the other in a first resonator stack. The first resonator, the second coupling system and the second resonator of the second electroacoustic system here may be arranged one above the other in a second resonator stack. In one embodiment, the two resonator stacks are electrically connected to one another.

In an embodiment, the first (or the second) coupling system comprises two sub-structures electrically connected to one another via an electrical connection that may be floating with respect to the remainder of the circuit, in particular, the terminals of the electric ports. The first resonator of the first (or second) electroacoustic system and the first substructure of the first (or second) coupling system are arranged one above the other and form a first resonator stack. The second resonator of the first (or second) electroacoustic system and the second substructure of the first (or second) coupling system are arranged one above the other and form a second resonator stack.

The input-side (or output-side) resonators can be connected in series, in inverse series, in parallel or in inverse parallel.

The resonators are connected in series if they are connected in series electrically and in-phase acoustically. In this case, the electroacoustic pulse in the two resonators connected in series, may be arranged in different stacks, is excited in the same direction. The resonators are connected in inverse series if they are connected in series electrically and in out-of-phase acoustically. In this case the electroacoustic pulses in the two resonators connected in series, e.g., arranged in different stacks, run in opposite directions.

The resonators are connected in parallel if they are connected in parallel electrically and in-phase acoustically. The resonators are connected in inverse parallel if they are connected in parallel electrically and in out-of-phase acoustically.

In case of an in-phase connection, i.e., series or parallel connection, of two resonators, the waves in the two resonators are excited in-phase relative to one direction. In case of an out-of-phase connection, i.e., inverse-series or inverse-parallel connection, of two resonators, the waves in the two resonators are excited in out-of-phase relative to one direction.

Either an in-phase connection or an out-of-phase connection may be used on both the input and the output side. In this case, it is possible to operate the input port and the output port symmetrically. A balun with the input or the output operated asymmetrically is also possible. It is also possible to operate both ports asymmetrically.

In one embodiment, it is also possible to use an in-phase connection on the input side and an out-of-phase connection on the output side. Thereby (with an electrical connection to reference potential of the series-connected input resonators), a voltage proportional to the differential voltage $\Delta U = U_1 - U_2$ of input voltages $U_1$ and $U_2$ is formed on the output side, the voltage $U_1$ being applied to the first input-side terminal and the voltage $U_2$ being applied to the second input-side terminal.

An impedance transformation in which the output impedance $Z_{out}$ is one-fourth the input impedance $Z_{in}$ is achieved with a series or inverse-series connection at the input and a parallel or inverse-parallel connection at the output. In particular, an impedance transformation from 200Ω to 50Ω can be achieved with this interconnection.

An impedance transformation in which the output impedance $Z_{out}$ is four times the input impedance $Z_{in}$ is achieved with a parallel or inverse-parallel connection at the input and a series or inverse-series connection at the output. In particular, an impedance transformation from 50Ω to 200Ω can be achieved with this interconnection.

The input and the output are interchangeable in all embodiments. If three or more signals are used instead of two, then other transformation ratios can be achieved by appropriate interconnection. The transformation factor can also be fine-tuned by adjustment of the surface areas of the input-side or output-side resonator electrodes. For instance, the transformation factor of the arrangement can reduced or increased by up to a factor of 2 (in addition to the transformation ratio defined by the interconnection) due to the larger electrode surface area for resonators of the input side or the output side.

Embodiments are described in detail below with reference to associated figures. The figures show various embodiments on the basis of schematic representations not drawn to scale. Identical or identically functioning parts are labeled with the same reference symbols.

DETAILED DESCRIPTION

Figure 1A:
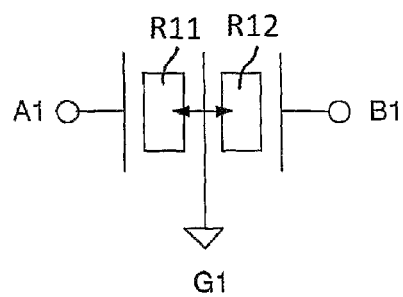
FIG. 1A, the equivalent circuit diagram of a known electroacoustic system with two resonators coupled acoustically and electrically to one another.
Figure 1B:
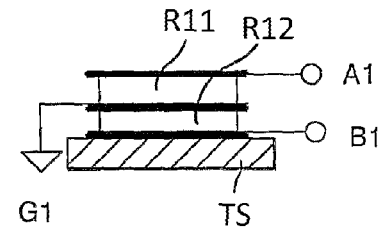
FIG. 1B, the system of FIG. 1A in cross section.

FIG. 1A shows an equivalent circuit diagram and FIG. 1B shows a realization of a resonator stack—arranged on a carrier substrate TS—with two electrically and acoustically coupled resonators R11, R12. The resonator stack is arranged between terminal A1 of the first port and terminal B1 of the second port. The inner electrode is connected to a reference potential G1.

Figure 2A:
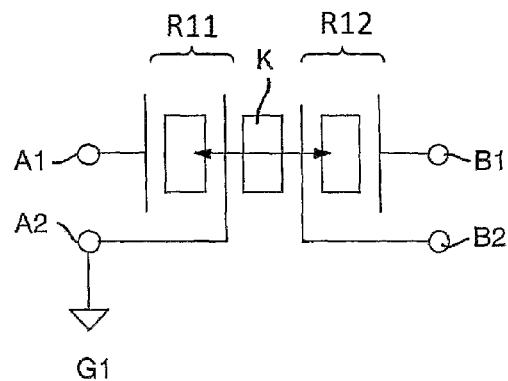
FIG. 2A, the equivalent circuit diagram of a known electroacoustic system with two resonators acoustically coupled to one another and galvanically separated from one another.
Figure 2B:
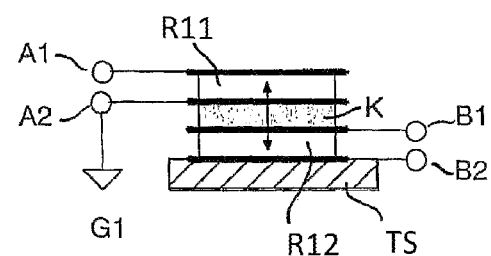
FIG. 2B, the system of FIG. 2A in cross section.

FIG. 2A shows an equivalent circuit diagram and FIG. 2B shows a realization of an additional resonator stack with two resonators R11, R12 acoustically coupled to one another by a coupling layer K and electrically isolated from one another by this layer. Resonator R11 is connected to an input port with terminals A1, A2, and resonator R12 is connected to a symmetric output port with terminals B1, B2. The input port is asymmetrically connected, with terminal A2 set to a reference potential G1.

Figure 3:
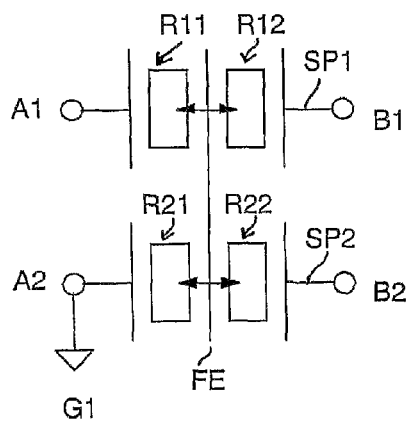
FIG. 3, the equivalent circuit diagram of a component with two electroacoustic systems electrically coupled to one another.

FIG. 3 shows a circuit with two signal paths SP1 and SP2, wherein an electroacoustic system (which may be realized by a resonator stack) with acoustically as well as electrically coupled resonators R11, R12, R21, R22 is arranged in each signal path SP1, SP2. As in FIG. 1B, an electroacoustic system can comprise resonators stacked one atop the other which share a common electrode and are acoustically coupled to one another via a vertical electrical coupling. First signal path SP1 is arranged between first terminals A1, B1 of the first and second port. Second signal path SP2 is arranged between second terminals A2, B2 of the first and second ports. The two electroacoustic systems are electrically connected to one another by a floating electrical connection FE.

In one embodiment, the first port is asymmetrically connected, second terminal A2 being conductively connected to a reference potential G1.

Hereinafter, the first electric port is referred to as an input port and the second electric port as the output port.

Figure 4A:
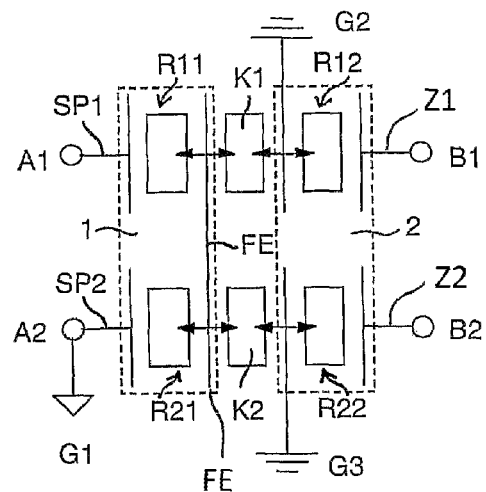
FIG. 4A, the equivalent circuit diagram of component with two electroacoustic systems coupled acoustically and electrically to one another, each forming a resonator stack.

A circuit according to one embodiment is shown in FIG. 4A. The circuit comprises a first branch Z1, constructed as a signal path SP1 and a second branch Z2 constructed as a second signal path SP2.

A first electroacoustic system that comprises two resonators R11 and R12, acoustically coupled to one another via a first coupling system K1 and galvanically separated from one another, is arranged in first branch Z1. A second electroacoustic system that comprises two resonators R21 and R22, acoustically coupled to one another via a second coupling system K2 and galvanically separated from one another, is arranged in second branch Z2.

The input-side resonators R11, R21 are connected here in series with one another via a floating electrical connection FE, and are connected to terminals A1, A2 of the first port. In one variant, the first port is symmetrically connected. It is also possible, however, to connect the first port asymmetrically by, for example, conductively connecting second terminal A2 to a first reference potential G1.

It is possible to isolate the two resonators associated with the same side, the output-side resonators in FIG. 4A, galvanically from one another. In this case each resonator can be operated symmetrically.

Output resonator R12 is arranged in FIG. 4A between first terminal B1 of the output port and a second reference potential G2. Output resonator R22 is arranged between second terminal B2 of the output port (or of an additional output port dependent on the first output port) and a third reference potential G3. Reference potentials G2, G3 need not be identical. It is possible, however, that G2=G3.

It is also possible, however, to operate the output port symmetrically, in which case, as shown in FIG. 4A, the electrodes of the output resonators connected to reference potentials G2, G3 are floating. With an asymmetrically interconnected input port, this corresponds to a balun.

Input-side resonators R11, R12 form a first sub-circuit 1 (input circuit) and output-side resonators R12, R22 form a second sub-circuit 2 (output circuit). Sub-circuits 1, 2 are acoustically coupled to one another via first coupling system K1 arranged in first signal path SP1 and second coupling system K2 arranged in signal path SP2, and are electrically isolated from one another by these coupling systems.

The directions of acoustic excitation in input transducers R11, R21 are offset from another by 180° in FIG. 4A.

Figure 4B:
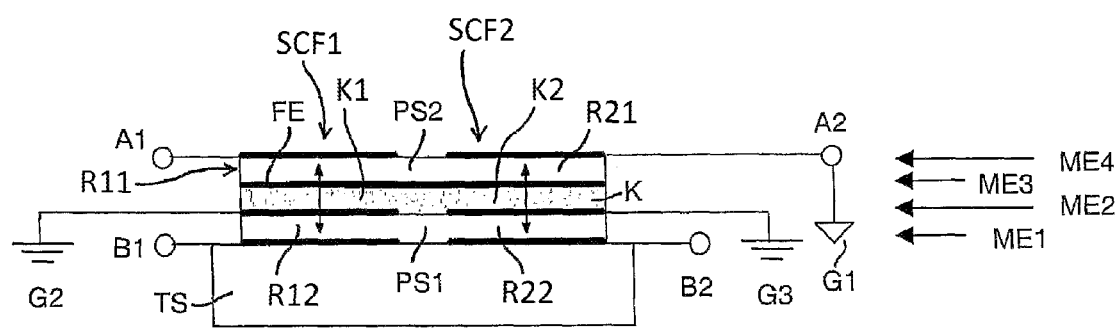
FIG. 4B, the system of FIG. 4A in cross section.

FIG. 4B shows an example of a realization of the circuit according to FIG. 4A as a multilayer system with two piezoelectric layers PS1, PS2, each arranged between two metal layers ME1, ME2 and ME3, ME4, respectively, which are structured into two electrodes of the corresponding resonator, with an acoustically partially transmissive coupling layer K lying between metal layers ME2 and ME3.

A bulk acoustic wave resonator, resonator R11, for example, is formed by electrodes facing one another and a piezoelectric layer PS2 situated therebetween.

The two coupling systems K1, K2 are realized in FIG. 4B by a common, at least partially acoustically transmissive coupling layer K. By exciting lateral wave modes in coupling layer K, it is possible to acoustically couple coupling systems K1, K2 in the lateral direction. Resonators arranged side by side but in different stacks, R11 and R12 (and/or R12 and R22), for example, can also be acoustically coupled to one another in the lateral direction by exciting lateral wave modes.

Input-side resonator R11, coupling system K1 and output-side resonator R12 form a first resonator stack SCF1. Input-side resonator R21, coupling system K2 and output-side resonator R22 form a second resonator stack SCF2. Resonators R11 and R12 (R21 and R22, respectively) are acoustically coupled to one another in the vertical direction via coupling system K1 (K2, respectively).

Floating electrical connection FE, which may represent a continuous conductive surface, is formed in metal layer ME3. The electrical coupling of resonator stacks SCF1 and SCF2 is realized with electrical connection FE.

First and second coupling systems K1, K2 are electrically coupled to one another in FIGS. 4A, 5A, 6 and 7 via floating electrical connection FE.

Figure 5A:
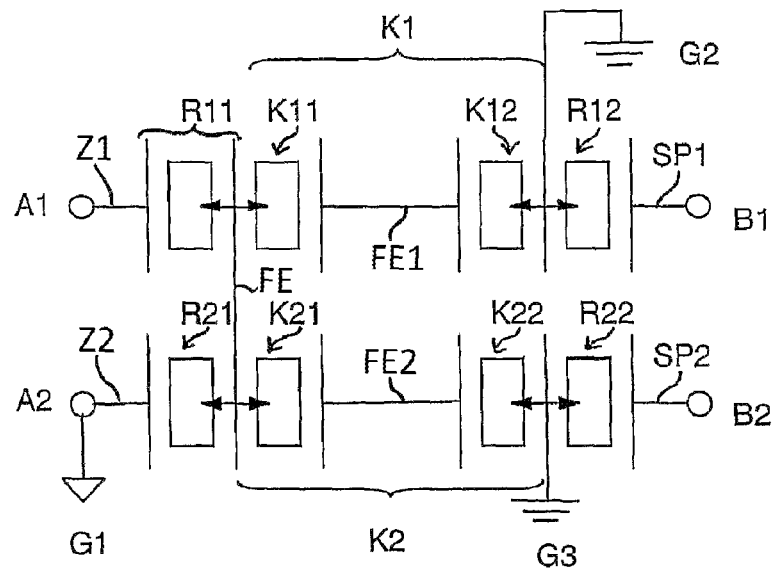
FIG. 5A, the equivalent circuit diagram of a component in which a coupling system comprises two electrically parts arranged in different resonator stacks.
Figure 5B:
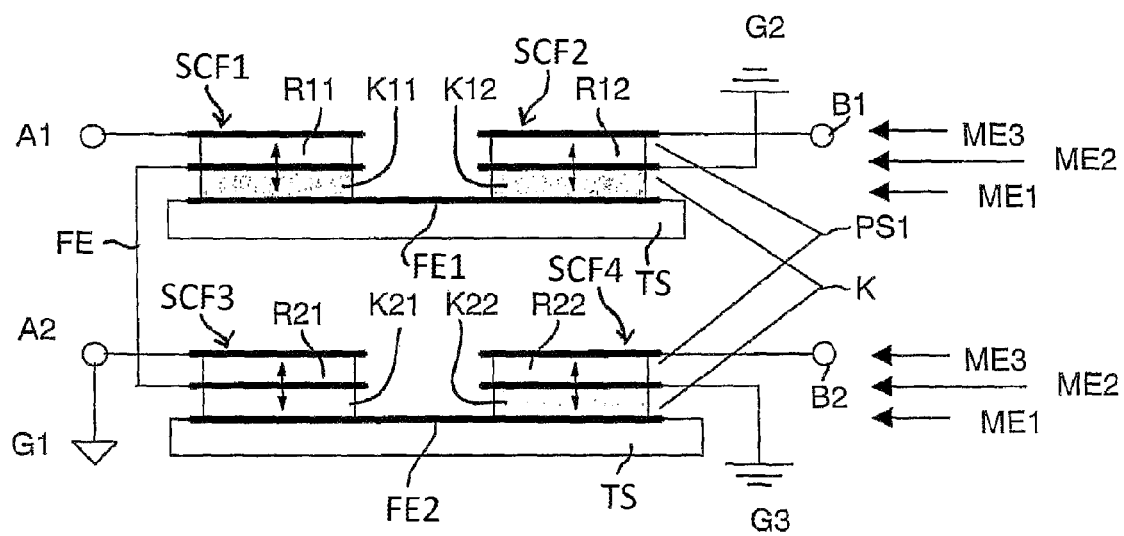
FIG. 5B, the system of FIG. 5A in cross section.

FIG. 5A shows the equivalent circuit diagram of one embodiment of the circuit according to FIG. 4A, and FIG. 5B shows the realization of this circuit.

The first electroacoustic system is subdivided here into two stacks, wherein first coupling system K1 (or second coupling system K2) comprises two parts K11 and K12 (K21 and K22, respectively). Parts K11, K12 of first coupling system K1 and parts K21, K22 of second coupling system K2 are respectively electrically connected to one another via a floating electrical connection FE1, FE2. The two floating electrical connections FE1, FE2 are arranged in the lowermost metal layer ME1.

Resonator R11 and first part K11 of first coupling system K1 are arranged one above the other and form a first stack SCF1. Resonator R12 and second part K12 of first coupling system K1 are arranged one above the other and form a second stack SCF2. Analogously, the third stack is formed from resonator R21 and first part K21 of second coupling system K2 arranged therebelow, and the fourth stack is formed from resonator R22 and second part K22 of second coupling system K2 arranged therebelow.

Parts K11, K12, K21, K22 of first and second coupling systems K1 and K2, respectively, comprise a piezoelectric layer and, together with the electrodes surrounding this layer, each forms a coupling resonator. The coupling resonators are electrically connected to one another.

Figure 5C:
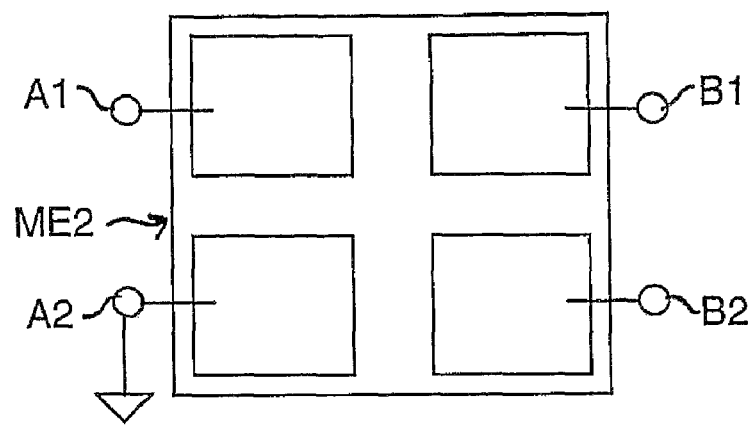
FIGS. 5C, 5D, 5E, a plan view onto different metallization planes of the component shown in FIG. 5B.
Figure 5D:
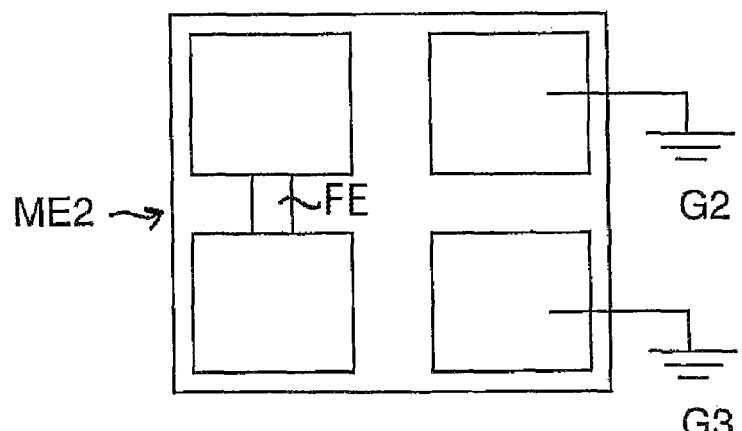
Figure 5E:
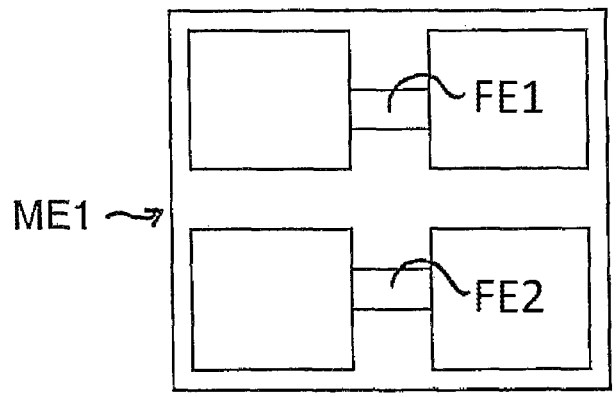

FIG. 5C shows the plan view of metal layer ME3 of the stack arrangement according to FIG. 5B. The plan views of metal layers ME2 and ME1 of the stack arrangement according to FIG. 5B are shown in FIGS. 5D and 5E.

In FIGS. 4B and 5B, an acoustic mirror with alternately arranged layers with low and high acoustic impedance can be provided between carrier substrate TS and lowermost metal layer ME1 of resonator stack SCF$_j$ (j=1-4)

The series connection of input resonators R11 and R21 is realized in FIG. 5B via an electrical connection formed in metal layer ME3, wherein the electrodes of the aforementioned resonators that lie on the inside of the stack are connected to one another. In the series connection of the resonators, it is also possible to connect the outer electrodes of the resonators and to connect their inner electrodes to terminals A1, A2 of the input port.

Figure 6:
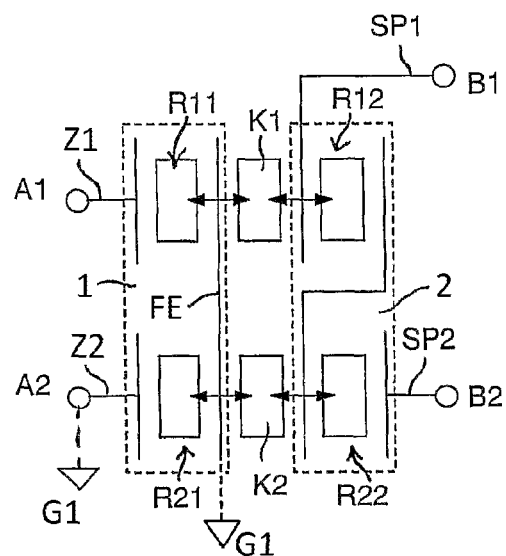
FIGS. 6, 7, in each case the equivalent circuit diagram of an additional component with two acoustically and electrically coupled systems, each forming a resonator stack.

FIG. 6 shows an additional possibility for interconnecting two electroacoustic systems. The first and second electroacoustic system respectively correspond, for example, to resonator stack SCF1 and SCF2 according to FIG. 4B. In this case, in contrast to FIG. 4A, the inner electrode, formed in metal layer ME2, of the first resonator stack is connected to first terminal B1 of the output port. The outer electrode (lowermost in FIG. 4B, situated in metal layer ME1) of the first resonator stack is electroconductively connected to an inner electrode, formed in metal layer ME2, arranged in the second resonator stack.

The acoustic excitation directions in input transducers R11, R21 are shifted in FIG. 6 by 180° relative to one another. The acoustic excitation directions in output transducers R12, R22, on the other hand, are in phase. In case the electrical connection between R11 and R21 is at signal ground G1, the difference between terminals A1 and A2 relative to signal ground G1 is picked off at output-side terminals B1 and B2.

The series connection of the resonators (output resonators R12 and R22 in FIG. 6) via their electrodes in different metal layers, which electrodes are arranged in different resonator stacks or associated with different signal paths, serves to set a phase relationship of, for example, 180° between the signals that are transmitted in signal paths SP1 and SP2.

Figure 7:
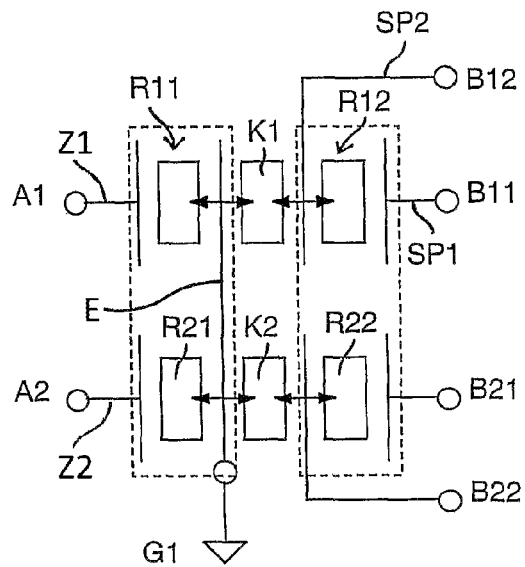

In one variant of the embodiments shown in FIGS. 4A, 6 and 7, terminal A2 of the input port is set to signal ground G1, output port B1, B2 being operated symmetrically.

A variant of the circuit in which signal paths SP1, SP2 comprise sub-paths connected in parallel to one another on the output side is shown in FIG. 7. In one variant, terminals B11 and B21 are connected to first terminal B1 and terminals B12 and B12 are connected to second terminal B2 of the output port.

In another variant, terminal B11 is connected to first terminal B1 and terminal B21 to second terminal B2 of the output port, where terminals B12 and B22 may be electrically connected to one another. Alternatively, terminal B12 can be connected to first terminal B1 and terminal B22 to second terminal B2 of the output port, where terminals B11 and B21 may be electrically connected to one another.

In the symmetrical input port in one embodiment, the electrical connection between input resonators R11 and R21 is set to signal ground G1. An output difference signal that is proportional to the difference of the input signals is formed with output resonators R12, R22 arranged in-phase and in series.

Figure 8:
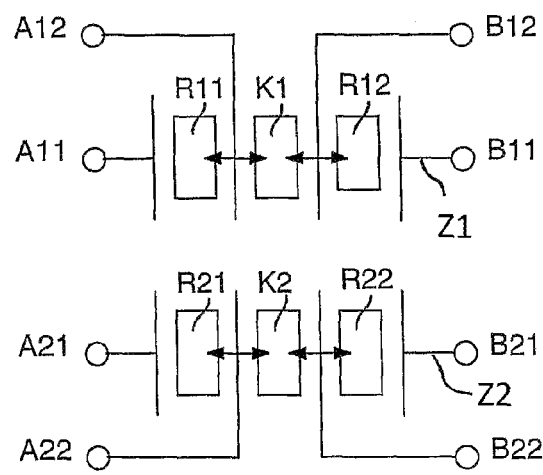
FIG. 8, two electroacoustic systems to be coupled, with terminals.

The interconnection possibilities present in FIGS. 4A, 6 and 7 can be summarized by the general arrangement according to FIG. 8.

FIG. 8 shows a first branch Z1 with a first electroacoustic system arranged therein and a second branch Z2 with a second electroacoustic system arranged therein. A11 and A12 are terminals of the first system that are connected to the electrodes of input-side resonator R11. B11 and B12 are terminals of the first system that are connected to the electrodes of output-side resonator R12. A21 and A22 are terminals of the second system that are connected to the electrodes of output-side resonator R21. B21 and B22 are terminals of the second system that are connected to the electrodes of output-side resonator R22.

Terminals Aij (i, j=1, 2) are electrically interconnected to one another and connected to an input port. Terminals Bij (i, j=1, 2) are electrically interconnected to one another and connected to an output port. The terminals that are electroconductively connected to an outer electrode in the resonator stack are labeled with Aij, Bij (j=1). The terminals that are electroconductively connected to an inner electrode in the resonator stack are labeled with Aij, Bij (j=2). There is the possibility of connecting the outer and/or inner electrodes to the corresponding electric port.

Terminal 11 may be connected to first terminal A1 of the input port and terminal B21 to second terminal B2 of the output port.

Terminal A21 may be connected to second terminal A2 of the input port. Terminals A12 and A22 can be electrically connected to one another. This electrical connection can be floating in one embodiment (cf. FIG. 6). In another embodiment (cf. FIG. 7), this electrical connection can be connected to a first reference potential. In this case, the input resonators R11, R21 of the two electroacoustic systems are connected in series with one another, the series circuit being connected to the input port (A11=A1, A2=A2).

In one embodiment, terminal B11 is connected to first terminal B1 of the output port. Terminals B12 and B22 here can be electrically connected to one another, and optionally to an additional reference potential. In this case, output resonators R12, R22 of the two electroacoustic systems are connected to one another in series, the series circuit being connected to the output port (B11=B1, B12=B2).

It is also possible to connect terminal B12 to a second reference potential, and terminal B22 to a third reference potential (cf. FIG. 4A).

It is also possible to connect terminals A11 and A12 to one another as well as to first terminal A1 of the input port, on the one hand, and to connect terminals A12 and A22 to one another as well as to second terminal A2 of the input port on the other (A11, A21=A1; A12, A22=A2). In this case, input resonators R11, R21 of the electroacoustic systems are interconnected in parallel, the parallel series being connected to the input port (A1, A2).

In one embodiment, terminals B11 and B12 are connected to one another as well as to first terminal B1 of the output port, on the one hand, and terminals B12 and B22 are connected to one another as well as to second terminal B2 of the output port on the other (B11, B21=B1; B12, B22=B2). In this case, output resonators R12, R22 of the electroacoustic systems are interconnected in parallel, the parallel circuit being connected to the output port (B1, B2).

In one embodiment, the input port can be operated as an output port, and the output port as an input port.

With an impedance transformation by a factor of 4 or ¼, respectively, two input resonators R11, R21 are connected to one another in series and two output resonators R12, R22 are connected to one another in parallel, or vice versa.

Figure 9:
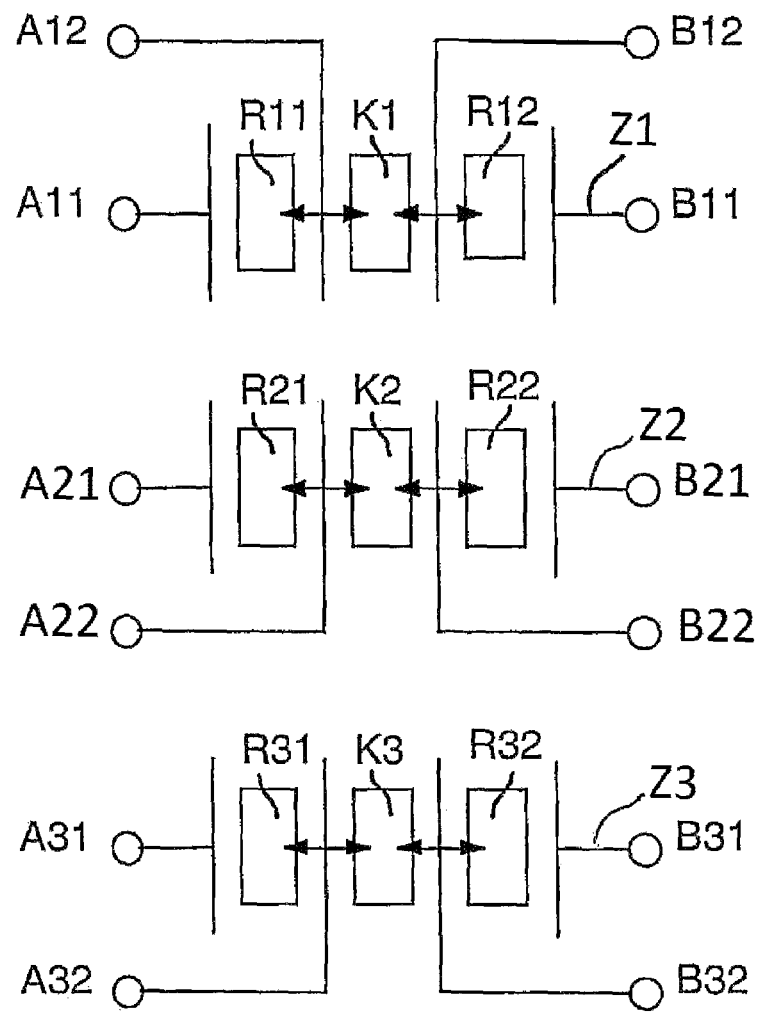
FIG. 9, three electroacoustic systems to be coupled, with terminals.

FIG. 9 shows three branches Z1, Z2, Z3, each with one electroacoustic system. Third branch Z3 comprises terminals A31, A32, B31, B32 and two resonators R31, R32 galvanically decoupled from one another by third coupling system K3.

Two input resonators or all input resonators Rj1 (j=1, 2, 3) can be connected in parallel or in series and be arranged between the terminals of the input port. Two output resonators or all output resonators Rj2 ((j=1, 2, 3) can be connected in parallel or in series and be arranged between the terminals of the output port. To achieve an impedance transformation, it is advantageous in FIGS. 9 and 10 to connect all input resonators in series or in inverse series, and all output resonators in parallel or in inverse parallel.

With three or more branches, the combination of a series and a parallel circuit of the resonators associated with the same side can be used, in particular, to achieve impedance transformation by an odd-numbered factor.

In the series connection of all input resonators, for example, terminal A11 is connected to first terminal A1 of the input port, and terminal A31 to second terminal A2 of the input port. In one variant, terminal A12 is connected to terminal A22, and terminal A21 to terminal A32. It is also possible, however, to connect two input resonators, e.g., resonators R11 and R21 in series to one another (A11=A1, A21=A2), with the third input resonator (resonator 31) either being connected in parallel to one of resonators R11, R21 (e.g. A31=A21. A32=A22), or in parallel to the series circuit of resonators R11 and R21 (A31=A1, A32=A2).

At least two, in one embodiment all, output resonators can likewise be arbitrarily interconnected to one another. The description of the interconnection of input resonators also applies to output resonators.

Figure 10:
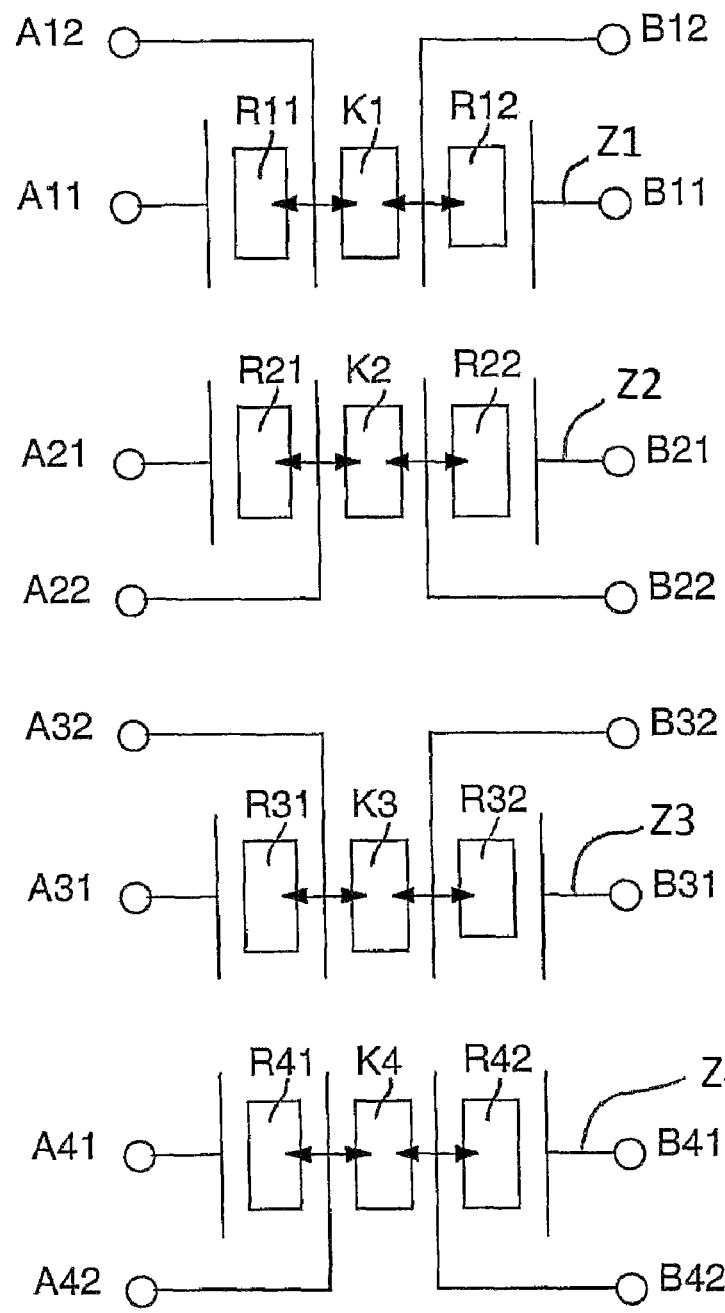
FIG. 10, four electroacoustic systems to be coupled, with terminals.

Four branches Z1-Z4, each with one electroacoustic system, are shown in FIG. 10. Fourth branch Z4 comprises terminals A41, A42, B41, B42, and two resonators R41, R42 galvanically decoupled from one another by fourth coupling system K4.

It is possible to connect all input resonators Rj1 and/or output resonators Rj2 to one another in series. It is also possible to connect all input resonators Rj1 and/or output resonators Rj2 to one another in parallel.

It is also possible to connect two resonators, input resonators, for example (e.g., R11 and R21 on the one hand, and R31 and R41 on the other) in series and to connect the series circuits in parallel to one another. In principle, arbitrary combinations of series and parallel connections, the input resonators always being galvanically decoupled from the output resonators by acoustic coupling systems Kj (j=1-4).

Thus far the electrical interconnection of branches designed as signal paths in FIGS. 8-10 was discussed. It is also possible, however, to arrange the electroacoustic systems in shunt arms and to connect the resonators, resonators Rj1 on the one hand, and resonators Rj2 on the other, to one another electrically as described.

A circuit of the type described herein can also comprise more than four electroacoustically coupled branches. It is possible to couple the electroacoustic systems arranged in the different branches to one another acoustically by, for example, coupling systems Kj. It is also possible to couple the resonators present in the different electroacoustic systems acoustically to one another via an additional acoustic coupling. This can be a lateral acoustic coupling of two resonators arranged side by side and also in different resonator stacks.

Different embodiments for the interconnection of coupled resonators are presented in FIGS. 11-20. The respective input resonator here is acoustically coupled to the output resonator may be arranged in the same stack; see FIG. 8.

The input (or output) may be made symmetrical in all embodiments with a symmetrically operated input port (or output port), i.e., the electrical connection of series-connected input resonators R11, R21 (or output resonators R12, R22) is set to signal ground. For the asymmetrically operated input port (or output port), second terminal A2, B2 of the corresponding port is set to signal ground (G1, G2 respectively). In an embodiment, the input side is related to first signal ground G1 and the output side to second signal ground G2. Second signal ground G2 may be isolated from first signal ground G1. It is also possible for the first and second signal grounds to be connected to one another (G2=G1). The optional connection to signal ground is shown in FIGS. 11-20 by directed arrows.

It is possible to operate both ports symmetrically. It is also possible to operate both ports asymmetrically. Using two interconnected resonator stacks, it is alternatively possible to realize a balun, wherein one of the ports is operated symmetrically and the other asymmetrically. Using interconnected resonator stacks it is further possible to realize an impedance transformer and/or a voltage difference forming circuit. It is additionally possible to perform a division of one signal into two separate signals (signal splitter).

The inverse interconnection of input resonators, wherein the electrical excitation in these resonators is shifted by 180° in comparison with the embodiments shown in the figures, is possible in all variants. This also applies to output resonators. The inversion can be performed on one side, either the input side or the output side. Inverse interconnection can also be done on both sides FIGS. 11-13B each show a resonator arrangement in which input resonators R11, R21 are connected in series, i.e., in-phase, one after the other.

Figure 11:
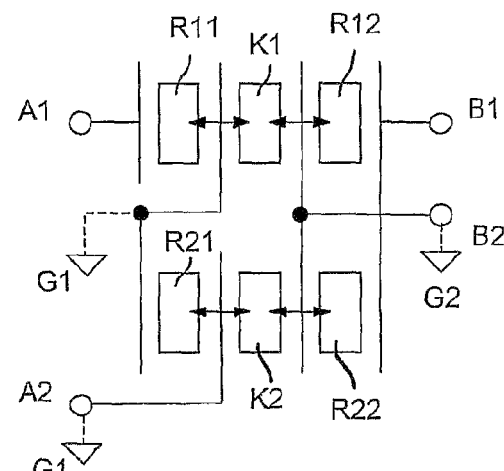
FIG. 11, resonator arrangement with input-side and output-side in-phase interconnection and impedance transformation.

Output resonators R12, R22 in FIG. 11 are connected to one another in parallel and in phase, the output impedance $Z_{out}$ amounting to one-fourth the input impedance $Z_{in}$. Additional resonator arrangements that realize an impedance transformation are presented in FIGS. 13A, 13B, 15, 16, 18 and 20.

Figure 12A:
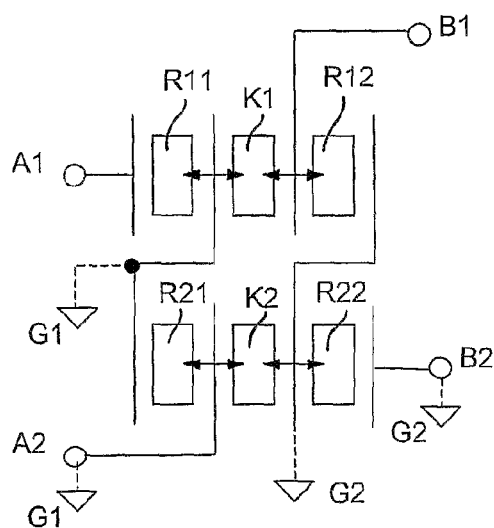
FIGS. 12A, 12B, in each case, a resonator arrangement with input-side and output-side in-phase series interconnection of resonators.
Figure 12B:
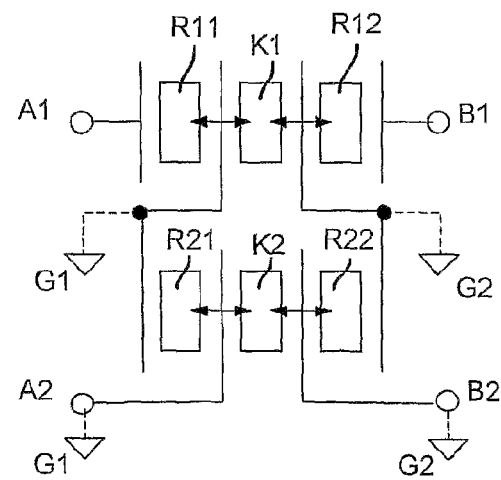

Output resonators R12, R22 can also be connected in series, as in FIG. 12A or 12B, wherein $Z_{out}=Z_{in}$. In FIG. 12B, the output side is inversely connected, with the electrical excitation running in opposite directions in resonators R11 and R12 (and R21 and R22 respectively) arranged in the respective signal path.

Figure 13A:
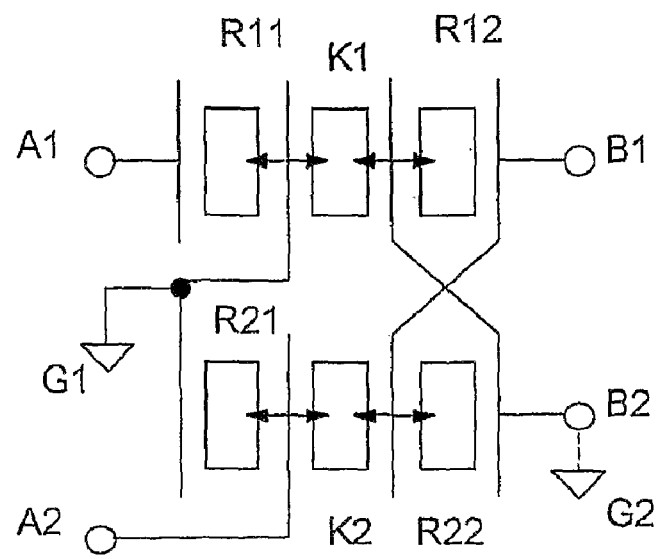
FIG. 13A, resonator arrangement with input-side in-phase interconnection, output-side out-of-phase interconnection and impedance transformation.
Figure 13B:
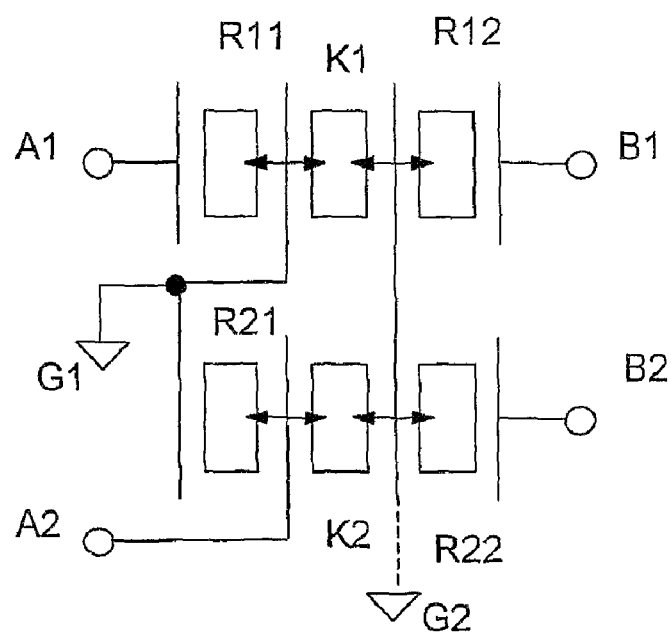
FIG. 13B, resonator arrangement with input-side in-phase series interconnection and output-side out-of-phase series interconnection.

Output resonators R12, R22 are connected in inverse parallel in FIG. 13A, and in inverse series in FIG. 13B. In FIG. 13B the same potential is present at terminals B1 and B2 if the electrical connection between output resonators R12 and R22 is at ground potential G2. Thus an input signal can be subdivided onto two outputs with the same polarity.

Figure 14:
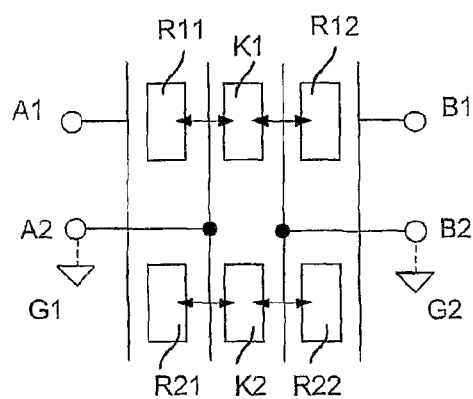
FIG. 14, resonator arrangement with input-side and output-side in-phase parallel interconnection of resonators.
Figure 15:
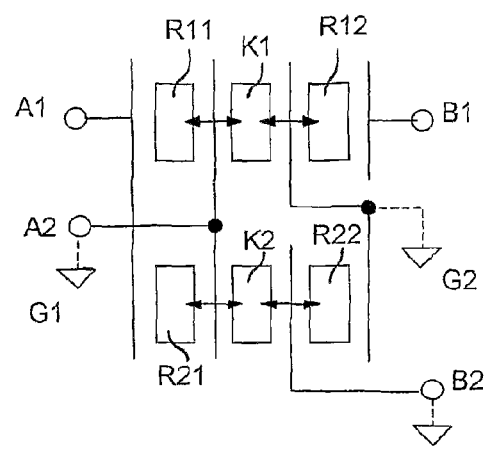
FIG. 15, resonator arrangement with input-side and output-side in-phase interconnection and impedance transformation.
Figure 16:
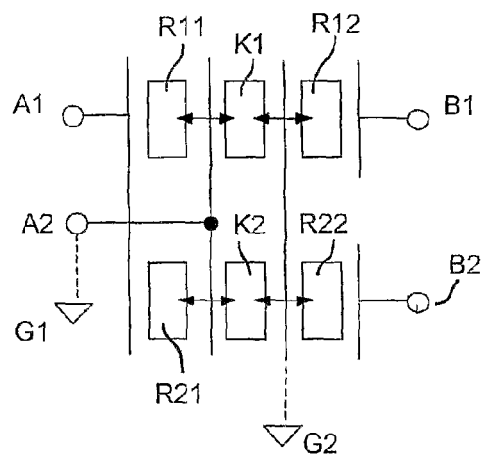
FIG. 16, resonator arrangement with input-side in-phase interconnection, output-side out-of-phase interconnection and impedance transformation.

Each of FIGS. 14-16 shows a resonator arrangement in which the input resonators R11, R21 are connected in parallel and in-phase.

In FIG. 14, output resonators R12, R22 are connected in-phase and in parallel. In FIG. 15, output resonators R12, R22 are connected in-phase and in series, and in inverse series in FIG. 16, with $Z_{out} \approx 4Z_{in}$.

Figure 17:
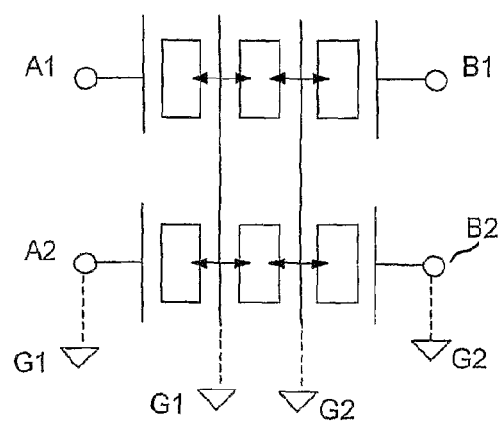
FIG. 17, resonator arrangement with input-side and output-side out-of-phase series interconnection of resonators.
Figure 18:
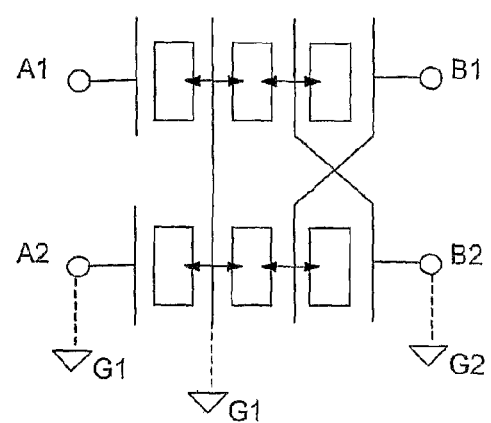
FIG. 18, resonator arrangement with input-side and output-side out-of-phase interconnection and impedance transformation.
Figure 19:
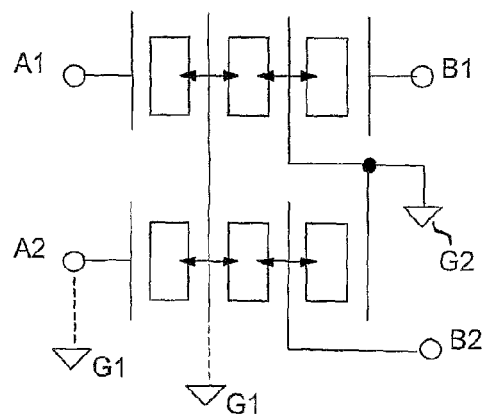
FIG. 19, resonator arrangement with input-side out-of-phase series interconnection and output-side in-phase series interconnection.
Figure 20:
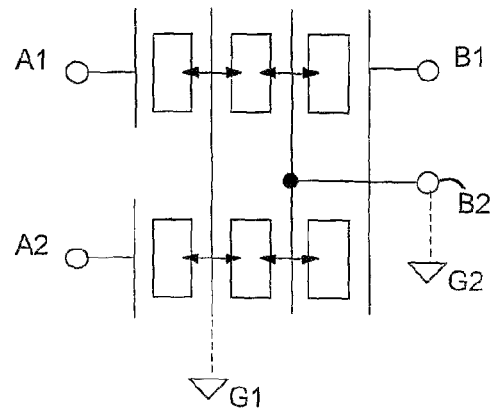
FIG. 20, resonator arrangement with input-side out-of-phase series interconnection, output-side in-phase parallel interconnection and impedance transformation FIG. 21A, a resonator stack operating with guided acoustic waves, in cross section.

FIGS. 17-20 each show a resonator arrangement in which the input resonators are connected in series and in out-of-phase. In FIG. 17, the output resonators are also connected in series and in out-of-phase. In FIG. 18, the output resonators are connected in inverse parallel. In FIG. 19, the output resonators are connected in series and in-phase. Identical signals that may be in phase relative to signal ground G2 can be present at both output-side terminals B1 and B2, with the splitting of the signal applied to input side terminals A1 and A2 taking place on the output side. Terminal B1 related to signal ground G1 defines a first output port, and terminal B2 related to signal ground G2 a second output port. The electrical connection between output-side resonators R12, R22 is then at signal ground G2. In FIG. 20, the output resonators are connected in-phase and in parallel.

In one embodiment it is provided that the reference numerals A1, A2, B1, B2 each refers to one terminal of a port related to its own signal ground. Terminals A1 and A2 in this case are associated with two different input ports and terminals B1 and B2 with two different output ports.

In one embodiment, terminal A1 in FIG. 17 is associated with the first input port related to the first signal ground, and terminal A2 is associated with in input port related to the second signal ground. The electrical connection between the series-connected input resonators is related to a third signal ground. The electrical connection between the series-connected output resonators is floating. In this case a voltage at the output is formed that is proportional to the difference in voltage between the two input ports.

The circuit described herein can also operate with guided bulk acoustic waves (GBAW=Guided Bulk Acoustic Waves), which propagate in the lateral direction in a piezoelectric layer.

Figure 21A:
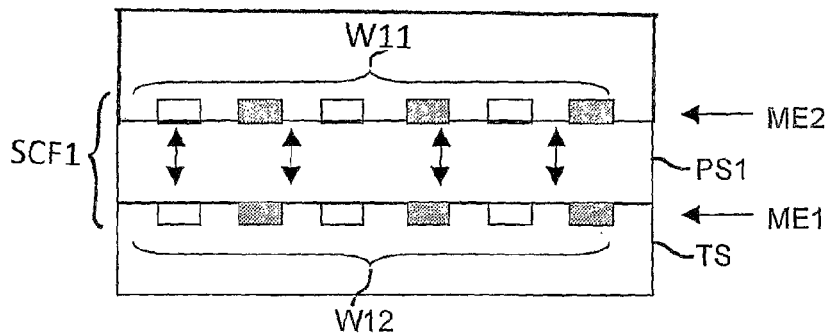
FIG. 21B, a plan view of an electroacoustic transducer.
Figure 21B:
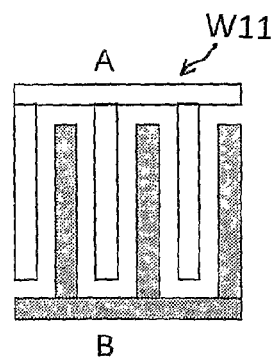

The realization of a circuit operating with GBAW is shown in FIG. 21A. A resonator corresponding to resonator R11 in FIGS. 4A, 4B, 5A, 5B, 6 and 7 is formed by a transducer W11 formed in metal layer ME2, and the underlying piezoelectric layer PS1. A transducer, shown for the sake of example in FIG. 21B comprises interdigitated comb-like electrodes A and B. The wave propagation direction (the x axis in FIGS. 11A-13) is referred to as the longitudinal direction, and the lateral direction perpendicular to it as the transversal direction A resonator corresponding to resonator R12 is formed by transducer W12 formed in a metal layer ME1, and the overlying piezoelectric layer PS1. Together, transducer W12, piezoelectric layer PS1 and transducer W11 form a first resonator stack SCF1.

Figure 22:
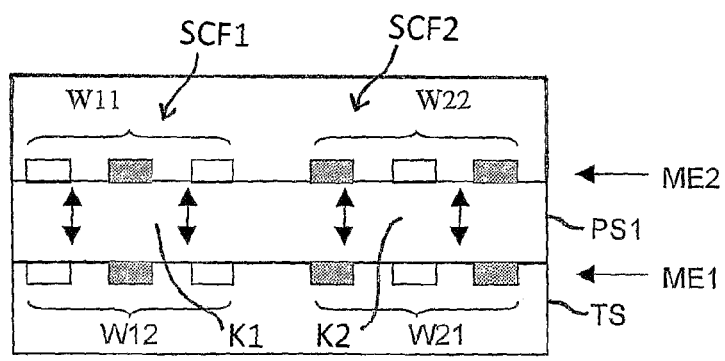
FIG. 22. a component operating with GBAW, with resonator stacks oriented side by side in the longitudinal direction, cut away in cross section.

An embodiment in which two resonator stacks SCF1 and SCF2 are arranged side by side in the lateral direction is shown in FIG. 22. It is also possible to arrange the resonator stacks side by side in the transversal direction.

The resonator corresponding to resonator R21 is formed here by a transducer W21 and the overlying piezoelectric layer PS1. The resonator corresponding to resonator R22 is formed by a transducer W22 and the underlying piezoelectric layer PS1. Transducer W21, piezoelectric layer PS1 and transducer W22 together form second resonator stack SCF2.

The resonators associated with the first branch, comprising, respectively, transducers W11 and W12 (as well as the resonators associated with the second branch, comprising, respectively, transducers W21 and W22) are acoustically coupled to one another in the vertical direction via piezoelectric layer PS1. The direction of acoustic coupling is indicated, as in FIGS. 11A, 12 and 13, by arrows.

The part of piezoelectric layer PS1 arranged between transducers W11 and W12 serves as first coupling system K1. The part of piezoelectric layer PS1 arranged between transducers W21 and W22 serves as second coupling system K2.

Coupling systems K1 and K2 of two resonator stacks SCF1, SCF2 arranged side by side in the longitudinal direction as in FIG. 22 can be acoustically coupled to one another by a longitudinal acoustic wave mode. For resonator stacks SCF1, SCF2 arranged side by side in the transversal direction, coupling systems K1 and K2 can be coupled acoustically to one another in the transversal direction by a transversal acoustic wave mode.

Figure 23:
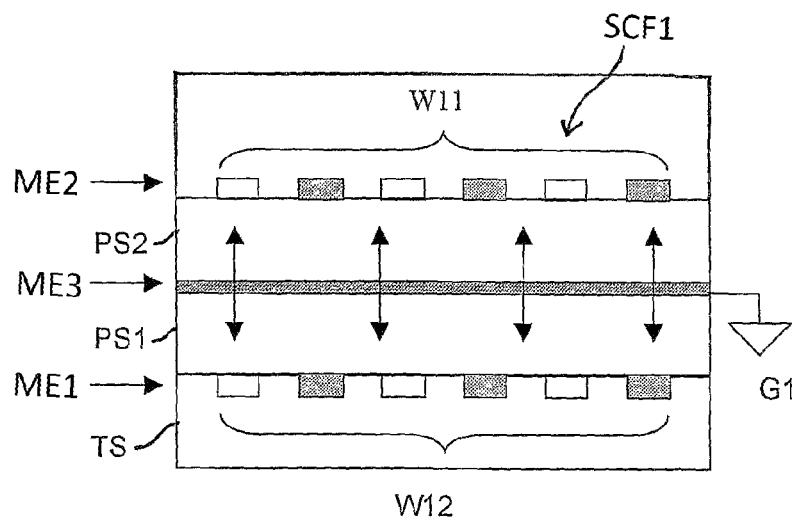
FIG. 23, a resonator stack operating with GBAW, with a reference potential surface, cut away in cross section.

An additional resonator stack operating with GBAW is shown in cross section in FIG. 23. Differently from FIG. 21A, two piezoelectric layers PS1 and PS2 between structured metal layers ME1 and ME2 are provided instead of only one piezoelectric layer. Piezoelectric layers PS1 and PS2 are separated from one another by a third metal layer M3, in which a continuous surface at signal ground is formed. Piezoelectric layers PS1, PS2 and the signal ground surface between them together form a coupling system.

The surface formed between transducers W11 and W12 can be electrically connected to a signal ground G1, but need not be.

Only a few embodiments have been described, but the claims are not limited thereto. The input-side (or output-side) resonators arranged in different resonator stacks can be acoustically coupled to one another by an acoustic mode that propagates transversely to the excitation direction (vertical direction in the case of bulk waves). The input-side (or output-side) resonators arranged in the same resonator stack can be electrically coupled to one another by a common electrode.

The interconnected input resonators can be acoustically coupled to one another by, for instance, lateral acoustic modes. This also applies to the output resonators. In GBAW configurations, the transducers of the resonators that are to be acoustically coupled to one another can be formed in one metallization plane, with the resonators acoustically coupled to one another in the lateral direction (instead of vertical acoustic coupling). It is advantageous in this case if the coupling system is constituted by a combination of the piezoelectric layer and an underlying continuous metal reference potential surface, the reference potential surface being arranged underneath the two transducers. A floating electrical connection can be used for the electrical coupling of resonators or resonator groups on the input side (or the output side).

Arbitrary combinations of input-side and output-side series and/or parallel circuits are possible (refers to in-phase and out-of-phase circuits).

By adjusting its thickness, the coupling system can be used for setting a given phase shift between the coupled resonators, which can serve, for instance, for suppressing harmonics.

An even number of resonators can be used for each side. An odd number of resonators can also be used for each side.

With three or more branches, the combination of a series and a parallel circuit of resonators associated with the same side can be used.

In FIGS. 8-10, the input-side and output-side resonators can be connected to a respective input or output port of their own. The resonators can be interconnected such that the number of input ports is not equal to the number of output ports. In principle, a resonator can be connected between the terminals of two different ports.

What is claimed is:

1. A circuit for use with bulk acoustic waves, the circuit comprising:
a first electroacoustic system in a first branch;
a second electroacoustic system in a second branch;
wherein the first electroacoustic system comprises a first resonator and a second resonator that are in series in the first branch, that are galvanically separated, and that are acoustically coupled by a first coupling system;
wherein the second electroacoustic system comprises a first resonator and a second resonator that are connected in series in the second branch, that are galvanically separated, and that are acoustically coupled by a second coupling system;
wherein the first and second electroacoustic systems are acoustically coupled via the first and second coupling systems and/or are electrically coupled; and
a first electric port and a second electric port, wherein at least one of the first and second electric ports is symmetrically interconnected;
wherein a first signal path is between first terminals of the first and second electric ports;
wherein a second signal path is between second terminals of the first and second electric ports;
wherein the first branch corresponds to the first signal path and the second branch corresponds to the second signal path;
wherein the second terminal of the first electric port is electrically connected to a first reference potential;
wherein the second resonator of the first electroacoustic system is between the first terminal of the second electric port and a second reference potential; and wherein the second resonator of the second electroacoustic system is between the second terminal of the second electric port and a third reference potential.

2. The circuit of claim 1, wherein the first and second electroacoustic systems are electrically coupled.

3. The circuit of claim 1, further comprising:
wherein the second branch corresponds to a first shunt arm connecting the first and second signal paths.

4. The circuit of claim 1,
wherein the first branch comprises a first shunt arm connecting the first and second signal paths, and the second branch comprises a second shunt arm in parallel with the first shunt arm.

5. The circuit of claim 1, wherein the first and second coupling systems are electrically connected via a floating electrical connection.

6. The circuit of claim 1, wherein the first and second coupling systems are capacitively or inductively coupled.

7. The circuit of claim 1, wherein the first and second coupling systems are connected electrically via an electrical connection connected to a first reference potential.

8. The circuit of claim 1, wherein the first resonators of the first and second electroacoustic systems are connected electrically in series.

9. The circuit of claim 1, wherein the second resonators of the first and second electroacoustic systems are connected electrically in series.

10. The circuit of claim 1, wherein the first resonators of the first and second electroacoustic systems are connected electrically in parallel.

11. The circuit of claim 1, wherein the second resonators of the first and second electroacoustic systems are connected electrically in parallel.

12. The circuit of claim 1, wherein each resonator comprises a transducer comprising an interdigitated comb-like electrode on a piezoelectric substrate.

13. The circuit of claim 1, wherein the first resonator, the first coupling system, and the second resonator of the first electroacoustic system are arranged in a first resonator stack; and
wherein the first resonator, the second coupling system, and the second resonator of the second electroacoustic system are arranged in a second resonator stack.

14. The circuit of claim 13, wherein the first and second resonator stacks are electrically connected.

15. The circuit of claim 1, wherein the first coupling system comprises a first sub-structure and a second sub-structure;
wherein the first resonator of the first electroacoustic system and the first sub-structure of the first coupling system form a first resonator stack;
wherein the second resonator of the first electroacoustic system and the second sub-structure of the first coupling system form a second resonator stack; and
wherein the first and second substructures of the first coupling system are electrically connected via an additional electrical connection.

16. The circuit of claim 15, wherein the second coupling system comprises a first sub-structure and a second sub-structure;
wherein the first resonator of the second electroacoustic system and the first sub-structure of the second coupling system form a third resonator stack;
wherein the second resonator of the second electroacoustic system and the second sub-structure of the second coupling system form a fourth resonator stack; and wherein the first and second substructures of the second coupling system are electrically connected via an additional electrical connection.

17. The circuit of claim 15, wherein the first and second sub-structures of the first coupling system are capacitively or inductively coupled.

18. The circuit of claim 1, wherein the first and second resonators of the first electroacoustic system are coupled vertically via the first coupling system, the first coupling system comprising a piezoelectric layer;
wherein the first and second resonators of the second electroacoustic system are coupled vertically via the second coupling system, the second coupling system comprising a piezoelectric layer; and
wherein the first coupling system and the second coupling system are adjacent and are acoustically coupled to each other in a transverse direction by a transverse acoustic wave mode.

19. The circuit of claim 1, further comprising:
one or more additional electroacoustic systems, each additional electroacoustic system being in a corresponding branch;
wherein each additional electroacoustic system comprises series-connected resonators that are galvanically separated, and acoustically coupled via a coupling system; and
wherein additional electroacoustic systems are acoustically coupled via coupling systems and/or are electrically coupled.

20. The circuit of claim 1, wherein an impedance of the first electric port differs from an impedance of the second electric port by a factor of two or more.

21. A circuit for use with bulk acoustic waves, the circuit comprising:
a first electroacoustic system in a first branch; and
a second electroacoustic system in a second branch;
wherein the first electroacoustic system comprises a first resonator and a second resonator that are in series in the first branch, that are galvanically separated, and that are acoustically coupled by a first coupling system;
wherein the second electroacoustic system comprises a first resonator and a second resonator that are connected in series in the second branch, that are galvanically separated, and that are acoustically coupled by a second coupling system;
wherein the first and second electroacoustic systems are acoustically coupled via the first and second coupling systems.

22. A component comprising:
the circuit of claim 21;
wherein resonators of the first and second electroacoustic systems operate with guided bulk acoustic waves;
wherein each resonator comprises a transducer and a piezoelectric layer arranged therebelow or thereabove; and
wherein each piezoelectric layer corresponds to a coupling system.

23. The component of claim 22, wherein resonators of a same electroacoustic system that are acoustically coupled are arranged in a stack and are acoustically coupled vertically.

24. The component of claim 22, wherein resonators of a same electroacoustic system that are acoustically coupled are arranged side-by-side in a longitudinal direction and are acoustically coupled in the longitudinal direction.

25. The component of claim 22, wherein resonators of a same electroacoustic system that are acoustically coupled are arranged side-by-side in a transverse direction and are acoustically coupled in the transverse direction.

26. The circuit of claim 21, wherein the first resonator, the first coupling system, and the second resonator of the first electroacoustic system are arranged in a first resonator stack; and
wherein the first resonator, the second coupling system, and the second resonator of the second electroacoustic system are arranged in a second resonator stack.

27. The circuit of claim 21, further comprising:
one or more additional electroacoustic systems, each additional electroacoustic system being in a corresponding branch;
wherein each additional electroacoustic system comprises series-connected resonators that are galvanically separated, and acoustically coupled via a coupling system; and
wherein additional electroacoustic systems are acoustically coupled via coupling systems.

28. The circuit of claim 21, wherein each resonator comprises a transducer comprising an interdigitated comb-like electrode on a piezoelectric substrate.

29. The circuit of claim 21, wherein the first and second resonators of the first electroacoustic system are coupled vertically via the first coupling system, the first coupling system comprising a piezoelectric layer;
wherein the first and second resonators of the second electroacoustic system are coupled vertically via the second coupling system, the second coupling system comprising a piezoelectric layer; and
wherein the first coupling system and the second coupling system are adjacent and are acoustically coupled to each other in a transverse direction by a transverse acoustic wave mode.

* * * * *

UNITED STATES PATENT AND TRADEMARK OFFICE
CERTIFICATE OF CORRECTION

PATENT NO. : 7,956,705 B2
APPLICATION NO. : 11/576985
DATED : June 7, 2011
INVENTOR(S) : Veit Meister and Werner Ruile It is certified that error appears in the above-identified patent and that said Letters Patent is hereby corrected as shown below:

Cover Page, Abstract: item (57),

Delete "The invention relates to a circuit operating with volume acoustic waves with at least electroacoustic systems, each arranged in a branch (Z1, Z2, Z3, Z4), wherein each electroacoustic system comprises at least two series-connected resonators (R11, R12; R21, R22; R31, R32; R41, R42) in the respective branch, which are galvanically separated from one another and acoustically coupled to one another by means of a coupling system (K1, K2, K3, K4) arranged therebetween. The electroacoustic systems are acoustically coupled via their coupling system (K1, K2) and/or electrically coupled to one another."

And Insert -- A circuit for use with bulk acoustic waves includes a first electroacoustic system in a first branch and a second electroacoustic system in a second branch. The first electroacoustic system includes a first resonator and a second resonator that are in series in the first branch, and that are galvanically separated, and acoustically coupled, by a first coupling system. The second electroacoustic system includes a first resonator and a second resonator that are connected in series in the second branch, and that are galvanically separated, and acoustically coupled, by a second coupling system. The first and second electroacoustic systems are acoustically coupled via the first and second coupling systems and/or electrically coupled. --

Column 14, Claim 3, Line 6

Delete "further comprising:"

Signed and Sealed this
Ninth Day of August, 2011

David J. Kappos
*Director of the United States Patent and Trademark Office*